United States Patent
Cok et al.

(10) Patent No.: US 10,438,859 B2
(45) Date of Patent: Oct. 8, 2019

(54) TRANSFER PRINTED DEVICE REPAIR

(71) Applicant: X-Celeprint Limited, Cork (IE)

(72) Inventors: Ronald S. Cok, Rochester, NY (US);
Erich Radauscher, Raleigh, NC (US);
David Gomez, Holly Springs, NC (US)

(73) Assignee: X-Celeprint Limited, Cork (IE)

( * ) Notice: Subject to any disclaimer, the term of this patent is extended or adjusted under 35 U.S.C. 154(b) by 105 days.

(21) Appl. No.: 15/845,791

(22) Filed: Dec. 18, 2017

(65) Prior Publication Data

US 2018/0174932 A1 Jun. 21, 2018

Related U.S. Application Data

(60) Provisional application No. 62/436,240, filed on Dec. 19, 2016.

(51) Int. Cl.
*H01L 21/66* (2006.01)
*H01L 23/00* (2006.01)
(Continued)

(52) U.S. Cl.
CPC ............ *H01L 22/22* (2013.01); *H01L 24/799* (2013.01); *H01L 24/98* (2013.01); *H01L 24/13* (2013.01); *H01L 24/16* (2013.01); *H01L 24/81* (2013.01); *H01L 25/0753* (2013.01); *H01L 33/62* (2013.01); *H01L 2224/136* (2013.01); *H01L 2224/1357* (2013.01);
(Continued)

(58) Field of Classification Search
None
See application file for complete search history.

(56) References Cited

U.S. PATENT DOCUMENTS 5,550,066 A 8/1996 Tang et al.
5,621,555 A 4/1997 Park
(Continued)

FOREIGN PATENT DOCUMENTS

GB 2 496 183 A 5/2013
WO WO-2006/027730 A1 3/2006
(Continued)

OTHER PUBLICATIONS

Bower, C. A. et al., Transfer Printing: An Approach for Massively Parallel Assembly of Microscale Devices, IEE, Electronic Components and Technology Conference, (2008).
(Continued)

*Primary Examiner* — Bradley Smith
(74) *Attorney, Agent, or Firm* — William R. Haulbrook; Michael D. Schmitt; Choate, Hall & Stewart LLP

(57) ABSTRACT

A repaired transfer printed system (e.g., micro-transfer printed system) includes a system substrate having two or more contact pads disposed on the system substrate. One or more transfer printed devices (e.g., micro-transfer printed devices) are disposed in contact with the system substrate, each device having two or more connection posts. Each connection post of a replacement device is in physical contact with a contact pad, the connection post forming a second imprint in the physically contacted contact pad. In certain embodiments, a first imprint is in at least one of the physically contacted contact pads and is between the replacement device and the system substrate.

23 Claims, 18 Drawing Sheets

(51) Int. Cl.
   *H01L 25/075* (2006.01)
   *H01L 33/62* (2010.01)
(52) U.S. Cl.
   CPC ............... *H01L 2224/13186* (2013.01); *H01L 2224/13562* (2013.01); *H01L 2224/16238* (2013.01); *H01L 2224/7999* (2013.01); *H01L 2224/95001* (2013.01); *H01L 2224/95136* (2013.01); *H01L 2224/98* (2013.01)

(56) References Cited

U.S. PATENT DOCUMENTS

| | | | |
|---|---|---|---|
| 5,815,303 | A | 9/1998 | Berlin |
| 5,994,722 | A | 11/1999 | Averbeck et al. |
| 6,025,730 | A | 2/2000 | Akram et al. |
| 6,084,579 | A | 7/2000 | Hirano |
| 6,142,358 | A | 11/2000 | Cohn et al. |
| 6,169,294 | B1 | 1/2001 | Biing-Jye et al. |
| 6,184,477 | B1 | 2/2001 | Tanahashi |
| 6,278,242 | B1 | 8/2001 | Cok et al. |
| 6,392,340 | B2 | 5/2002 | Yoneda et al. |
| 6,466,281 | B1 | 10/2002 | Huang et al. |
| 6,577,367 | B2 | 6/2003 | Kim |
| 6,660,457 | B1 | 12/2003 | Imai et al. |
| 6,703,780 | B2 | 3/2004 | Shiang et al. |
| 6,717,560 | B2 | 4/2004 | Cok et al. |
| 6,756,576 | B1 | 6/2004 | McElroy et al. |
| 6,812,637 | B2 | 11/2004 | Cok et al. |
| 6,828,724 | B2 | 12/2004 | Burroughes |
| 6,876,212 | B2 | 4/2005 | Fjelstad |
| 6,933,532 | B2 | 8/2005 | Arnold et al. |
| 6,969,624 | B2 | 11/2005 | Iwafuchi et al. |
| 7,012,382 | B2 | 3/2006 | Cheang et al. |
| 7,091,523 | B2 | 8/2006 | Cok et al. |
| 7,098,589 | B2 | 8/2006 | Erchak et al. |
| 7,127,810 | B2 | 10/2006 | Kasuga et al. |
| 7,129,457 | B2 | 10/2006 | McElroy et al. |
| 7,195,733 | B2 | 3/2007 | Rogers et al. |
| 7,259,391 | B2 | 8/2007 | Liu et al. |
| 7,288,753 | B2 | 10/2007 | Cok |
| 7,354,801 | B2 | 4/2008 | Sugiyama et al. |
| 7,402,951 | B2 | 7/2008 | Cok |
| 7,420,221 | B2 | 9/2008 | Nagai |
| 7,466,075 | B2 | 12/2008 | Cok et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,605,053 | B2 | 10/2009 | Couillard et al. |
| 7,622,367 | B1 | 11/2009 | Nuzzo et al. |
| 7,662,545 | B2 | 2/2010 | Nuzzo et al. |
| 7,687,812 | B2 | 3/2010 | Louwsma et al. |
| 7,704,684 | B2 | 4/2010 | Rogers et al. |
| 7,791,271 | B2 | 9/2010 | Cok et al. |
| 7,799,699 | B2 | 9/2010 | Nuzzo et al. |
| 7,816,856 | B2 | 10/2010 | Cok et al. |
| 7,834,541 | B2 | 11/2010 | Cok |
| 7,893,612 | B2 | 2/2011 | Cok |
| 7,919,342 | B2 | 4/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,969,085 | B2 | 6/2011 | Cok |
| 7,972,875 | B2 | 7/2011 | Rogers et al. |
| 7,982,296 | B2 | 7/2011 | Nuzzo et al. |
| 7,990,058 | B2 | 8/2011 | Cok et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,198,621 | B2 | 6/2012 | Rogers et al. |
| 8,207,547 | B2 | 6/2012 | Lin |
| 8,243,027 | B2 | 8/2012 | Hotelling et al. |
| 8,261,660 | B2 | 9/2012 | Menard |
| 8,288,843 | B2 | 10/2012 | Kojima et al. |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,450,927 | B2 | 5/2013 | Lenk et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,558,243 | B2 | 10/2013 | Bibl et al. |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,735,932 | B2 | 5/2014 | Kim et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,835,940 | B2 | 9/2014 | Hu et al. |
| 8,854,294 | B2 | 10/2014 | Sakariya |
| 8,860,051 | B2 | 10/2014 | Fellows et al. |
| 8,865,489 | B2 * | 10/2014 | Rogers ............... H01L 25/0753 438/27 |
| 8,877,648 | B2 | 11/2014 | Bower et al. |
| 8,884,844 | B2 | 11/2014 | Yang et al. |
| 8,889,485 | B2 | 11/2014 | Bower |
| 8,895,406 | B2 | 11/2014 | Rogers et al. |
| 8,902,152 | B2 | 12/2014 | Bai et al. |
| 8,941,215 | B2 | 1/2015 | Hu et al. |
| 8,946,760 | B2 | 2/2015 | Kim |
| 8,987,765 | B2 | 3/2015 | Bibl et al. |
| 9,105,714 | B2 | 8/2015 | Hu et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,166,114 | B2 | 10/2015 | Hu et al. |
| 9,178,123 | B2 | 11/2015 | Sakariya et al. |
| 9,202,996 | B2 | 12/2015 | Orsley et al. |
| 9,217,541 | B2 | 12/2015 | Bathurst et al. |
| 9,358,775 | B2 | 6/2016 | Bower et al. |
| 9,367,094 | B2 | 6/2016 | Bibl et al. |
| 9,478,583 | B2 | 10/2016 | Hu et al. |
| 9,484,504 | B2 | 11/2016 | Bibl et al. |
| 9,555,644 | B2 | 1/2017 | Rogers et al. |
| 9,601,356 | B2 | 3/2017 | Bower et al. |
| 9,640,715 | B2 | 5/2017 | Bower et al. |
| 9,761,754 | B2 | 9/2017 | Bower et al. |
| 9,765,934 | B2 | 9/2017 | Rogers et al. |
| 9,786,646 | B2 | 10/2017 | Cok et al. |
| 9,865,832 | B2 | 1/2018 | Bibl et al. |
| 9,929,053 | B2 | 3/2018 | Bower et al. |
| 2001/0022564 | A1 | 9/2001 | Youngquist et al. |
| 2002/0003132 | A1 | 1/2002 | Scalzotto |
| 2002/0096994 | A1 | 7/2002 | Iwafuchi et al. |
| 2003/0141570 | A1 | 7/2003 | Chen et al. |
| 2004/0212296 | A1 | 10/2004 | Nakamura et al. |
| 2004/0227704 | A1 | 11/2004 | Wang et al. |
| 2004/0252933 | A1 | 12/2004 | Sylvester et al. |
| 2005/0006657 | A1 | 1/2005 | Terashita |
| 2005/0012076 | A1 | 1/2005 | Morioka |
| 2005/0116621 | A1 | 6/2005 | Bellmann et al. |
| 2005/0140275 | A1 | 6/2005 | Park |
| 2005/0168987 | A1 | 8/2005 | Tamaoki et al. |
| 2005/0202595 | A1 | 9/2005 | Yonehara et al. |
| 2005/0275615 | A1 | 12/2005 | Kahen et al. |
| 2005/0285246 | A1 | 12/2005 | Haba et al. |
| 2006/0051900 | A1 | 3/2006 | Shizuno |
| 2007/0035340 | A1 | 2/2007 | Kimura |
| 2007/0077349 | A1 | 4/2007 | Newman et al. |
| 2007/0201056 | A1 | 8/2007 | Cok et al. |
| 2008/0108171 | A1 | 5/2008 | Rogers et al. |
| 2008/0211734 | A1 | 9/2008 | Huitema et al. |
| 2009/0315054 | A1 | 12/2009 | Kim et al. |
| 2010/0078670 | A1 | 4/2010 | Kim et al. |
| 2010/0123134 | A1 | 5/2010 | Nagata |
| 2010/0123268 | A1 | 5/2010 | Menard |
| 2010/0148198 | A1 | 6/2010 | Sugizaki et al. |
| 2010/0190293 | A1 | 7/2010 | Maeda et al. |
| 2010/0214247 | A1 | 8/2010 | Tang et al. |
| 2010/0248484 | A1 | 9/2010 | Bower et al. |
| 2010/0258710 | A1 | 10/2010 | Wiese et al. |

(56) References Cited

U.S. PATENT DOCUMENTS

| | | |
|---|---|---|
| 2010/0289115 A1 | 11/2010 | Akiyama et al. |
| 2010/0306993 A1 | 12/2010 | Mayyas et al. |
| 2010/0317132 A1 | 12/2010 | Rogers et al. |
| 2011/0032442 A1 | 2/2011 | van Aerle et al. |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0316487 A1 | 11/2013 | de Graff et al. |
| 2014/0104243 A1 | 4/2014 | Sakariya et al. |
| 2014/0159043 A1 | 6/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0348926 A1 | 12/2015 | Bower |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1* | 12/2015 | Bower ............... H01L 33/007 438/110 |
| 2015/0373793 A1 | 12/2015 | Bower et al. |
| 2016/0005721 A1 | 1/2016 | Bower et al. |
| 2016/0011122 A1 | 1/2016 | Pacheco et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2017/0025075 A1 | 1/2017 | Cok et al. |
| 2017/0048976 A1* | 2/2017 | Prevatte ............... H01L 24/11 |
| 2017/0098729 A1 | 4/2017 | Fisher et al. |
| 2017/0186740 A1 | 6/2017 | Cok et al. |
| 2017/0213502 A1 | 7/2017 | Henry et al. |
| 2017/0338374 A1 | 11/2017 | Zou et al. |
| 2018/0315672 A1 | 11/2018 | Cassier et al. |

FOREIGN PATENT DOCUMENTS

| | | |
|---|---|---|
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Hamer et al., 63.2: AMOLED Displays Using Transfer-Printed Integrated Circuits, SID 09 Digest, 40(2):947-950 (2009).

Lee, S. H. etal, Laser Lift-Offof GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Yaniv et al., A 640x480 Pixel Computer Display Using Pin Diodes with Device Redundancy, 1988 International Display Research Conference, IEEE, CH-2678-1/88:152-154 (1988).

\* cited by examiner

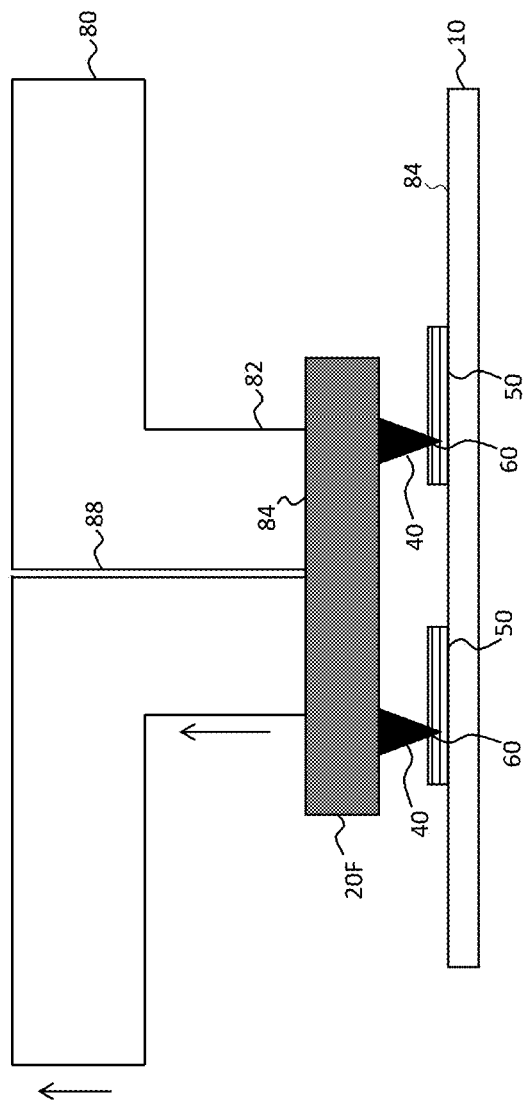

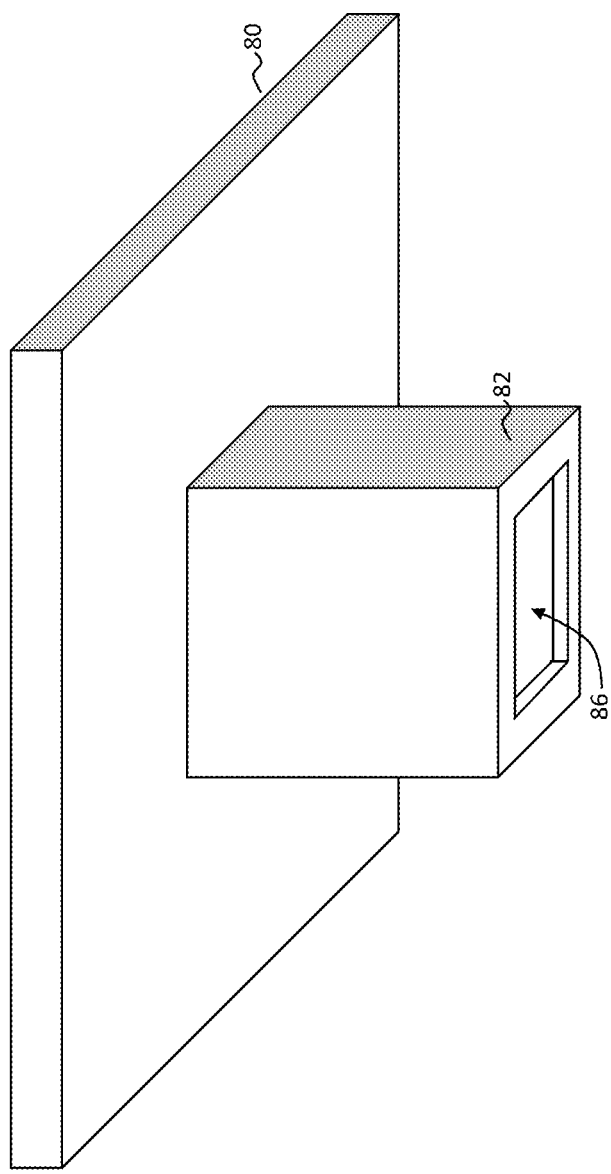

TRANSFER PRINTED DEVICE REPAIR

PRIORITY APPLICATION

This application claims the benefit of U.S. Provisional Patent Application No. 62/436,240, filed Dec. 19, 2016, entitled Micro-Transfer Printed Device Repair, the content of which is hereby incorporated by reference herein in its entirety.

CROSS REFERENCE TO RELATED APPLICATIONS

Reference is made to commonly assigned U.S. patent application Ser. No. 14/743,788 to Bower et al., entitled Micro Assembled LED Displays and Lighting Elements and filed Jun. 18, 2015, U.S. patent application Ser. No. 14/822,864 to Prevatte et al., entitled Chiplets with Connection Posts and filed Aug. 10, 2015, U.S. patent application Ser. No. 14/807,226 to Cok et al., entitled Parallel Redundant Chiplet System and filed Jul. 23, 2015, U.S. Provisional Patent Application No. 62/317,107 to Bower et al., entitled Pressure Activated Electrical Interconnection by Micro-Transfer Printing and filed Apr. 1, 2016, and U.S. patent application Ser. No. 15/040,810 to Cok et al., entitled Matrix-Addressed Device Repair and filed Feb. 10, 2016, the disclosures of which are incorporated herein by reference in their entirety.

FIELD OF THE INVENTION

The present invention relates to structures and methods for providing robust and repairable transfer printed (e.g., micro-transfer printed) electronic systems.

BACKGROUND OF THE INVENTION

Substrates with electronically active components distributed over the extent of the substrate may be used in a variety of electronic systems, for example, flat-panel imaging devices, such as liquid crystal, organic light-emitting diode (OLED), or inorganic light-emitting diode (iLED) display devices, and solar cells.

One method used to distribute electronically active circuits over substrates includes sputtering a thin semiconductor layer over the substrate and then patterning the semiconductor layer to form electronically active circuits distributed over the substrate. This technique, although widely used in the display industry, has performance limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Publication No. 2010/0289115 and U.S. Patent Publication No. 2010/0123134. However, such substrate materials can be more expensive, limited in size, or difficult to process.

In other manufacturing techniques, a mono-crystalline semiconductor wafer is employed as the substrate. While this approach can provide substrates with the same performance as integrated circuits, the size of such substrates may be limited, for example to a 12-inch diameter circle, the wafers are relatively expensive compared to other substrate materials such as glass, polymer, or quartz, and the wafers are rigid.

An alternative method used to distribute electronically active circuits over substrates includes forming the components on separate source wafers, removing them from the source wafers, and placing the components on the desired substrate. In this case, a variety of assembly technologies for device packaging may be used, for example, pick-and-place technologies for integrated circuits provided in a variety of packages such as pin-grid arrays, ball-grid arrays, and flip-chips. However, these techniques may be limited in the size of the integrated circuits that can be placed so that the integrated circuits and their packaging can be larger and more expensive than is desired.

Other methods for transferring active components from a source wafer to a desired substrate are described in U.S. Pat. No. 7,943,491. In certain embodiments of these methods, small integrated circuits are formed on a semiconductor wafer. The small integrated circuits, or chiplets, are released from the wafer by etching a layer formed beneath the circuits. A stamp, for example a PDMS stamp, is pressed against the wafer and the process side of the chiplets is adhered to the stamp. The chiplets on the stamp are pressed against a destination substrate or backplane and adhered to the destination substrate. U.S. Pat. No. 8,722,458 entitled Optical Systems Fabricated by Printing-Based Assembly teaches, inter alia, transferring light-emitting, light-sensing, and light-collecting semiconductor elements from a wafer substrate to a destination substrate or backplane.

In some cases, the source wafer or destination substrate can have particulate contamination that inhibits element transfer from the source wafer to the destination substrate by the stamp, for example due to process abnormalities or undesired particles on the stamp, the source wafer, or the destination substrate. It is also possible that the elements themselves are defective due to materials or manufacturing process errors in the wafer. Such problems can reduce manufacturing yields, increase product costs, and necessitate expensive repair or rework operations.

Electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic, for example it can be difficult to form a continuous conductor from the destination substrate to the small integrated circuit because of the differences in height over the surface between the small integrated circuits and the destination substrate.

Surface-mount devices (SMDs) are an alternative way to provide electrical elements on a substrate or backplane. Such devices, as their name suggests, include electrical connections that are typically placed on the surface and in contact with a backplane rather than including pins that extend through vias in the backplane. Surface-mount technology (SMT) is widely used in the electronics industry to provide high-density printed-circuit boards (PCBs). In particular, a well-developed and inexpensive infrastructure exists for making and integrating two-terminal surface-mount devices, such as resistors or capacitors, into printed circuit boards. However, the smallest surface-mount device readily available is several hundred microns long and wide, precluding their use for applications requiring integrated circuits with circuit elements having a size of several microns, or less, for example.

There is a need, therefore, for structures and methods that enable the electrical interconnection of small integrated circuits (chiplets) at a high resolution, such as transfer printed chiplets, to destination substrates in a cost-effective and robust way with excellent yields.

SUMMARY OF THE INVENTION

In accordance with certain embodiments of the present invention, a repaired micro-transfer-printed system includes a system substrate with two or more contact pads disposed on the system substrate. One or more micro-transfer printed devices, each having two or more connection posts, are disposed in contact with the contact pads or system substrate. Each connection post is in physical contact with a contact pad and forms a second imprint in the physically contacted contact pad. A first imprint is present in at least one of the physically contacted contact pads that is between the device and the system substrate.

In certain embodiments, the system is an electronic system, the connection posts are electrically conductive connection posts, and the device is an electronic device responsive to electrical signals received through the connection posts or providing electrical signals through the connection posts.

In some embodiments, each of the contact pads extend beyond the device. In some embodiments, the contact pads are covered by the device. The device can include at least a portion of a tether. The connection posts can pierce or deform the contact pads that they physically contact. The device can include one or more micro-transfer printed integrated circuits, each micro-transfer printed integrated circuit having a fractured, broken, or separated tether.

In some embodiments, an adhesive adheres the device to the system substrate. The adhesive can be a non-conductive adhesive or a conductive adhesive adhering a connection post to a contact pad.

According to certain embodiments of the present invention, a method of making a system comprises providing a system substrate with two or more contact pads disposed on the system substrate, providing one or more source wafers each having one or more micro-transfer printed devices disposed thereon, each device having two or more connection posts, transfer printing (e.g., micro-transfer printing) one or more devices from one or more source wafers to the contact pads with a transfer stamp having a corresponding one or more transfer stamp pillars so that each connection post physically contacts a contact pad and forms a first imprint in the physically contacted contact pad, removing at least one defective device from the contact pads or system substrate to provide at least one exposed, imprinted contact pad having the first imprint, and transfer printing (e.g., micro-transfer printing) a replacement device from a source wafer to the contact pads so that at least one connection post physically contacts the exposed, imprinted contact pad to form a second imprint. In certain embodiments, the first imprint is covered by the replacement device.

In some embodiments, the transfer printed devices are tested to determine one or more defective devices.

Removing a defective device from the system substrate can include providing a removal stamp having a removal stamp pillar and dislodging the defective device from the contact pads with the removal stamp pillar by contacting the defective device with the removal stamp pillar. The defective device can be removed from the system substrate by translating the removal stamp pillar over the surface of the system substrate. The removal stamp pillar can have a structured distal end with a cavity having a cavity size that is larger than the defective device and the method including locating the defective device within the cavity. Removal methods such as laser removal or capacitive discharge can be used.

The device can have an edge that extends an edge length in a direction substantially parallel to the system substrate surface and the removal stamp pillar can have a side with a length equal to or greater than the edge length. The defective device can have a length greater than a width and the removal stamp pillar can contact the defective device along at least a portion of the length of the defective device.

The removal stamp pillar can have an adhesive distal end having an adhesion greater than the adhesion of a transfer stamp pillar to the defective device so that the removal stamp pillar can remove and hold a defective device. The removal stamp pillar can be harder than the transfer stamp pillar. The removal stamp can have only one pillar. The removal stamp pillar can have a channel through which compressed gas can be expelled or through which a partial vacuum can be applied to adhere the defective device to the removal stamp pillar.

In certain embodiments, a method includes blowing a gas onto the defective device or sucking up the defective device with at least a partial vacuum.

In certain embodiments, the present invention enables, inter alia, large arrays of devices on a system substrate that are subject to manufacturing variability and provides simple and robust electrical interconnections. The devices can be transfer printed to a system substrate at a relative high resolution.

In one aspect, the present invention is directed to a repaired transfer-printed system, comprising: a system substrate; two or more contact pads disposed on the system substrate; one or more transfer printed devices, each device comprising two or more connection posts, wherein each connection post is in physical contact with a contact pad of the two or more contact pads and forms a second imprint in the contact pad; and a first imprint in at least one of the physically contacted contact pads that is between the device and the system substrate.

In certain embodiments, the system is an electronic system, the connection posts are electrically conductive connection posts, and the device is an electronic device (i) responsive to electrical signals received through the connection posts or (ii) providing electrical signals through the connection posts.

In certain embodiments, the contact pads extend beyond each of the one or more devices. In certain embodiments, the contact pads are covered by each of the one or more devices.

In certain embodiments, each of the one or more devices comprises at least a portion of a tether.

In certain embodiments, each of the two or more connection posts of each device pierce or deform each contact pad that they physically contact. In certain embodiments, each of the two or more connection posts of each device is a multi-layer connection post comprising an electrically conductive layer disposed on a dielectric core.

In certain embodiments, the system comprises a non-conductive adhesive adhering each of the one or more devices to the system substrate. In certain embodiments, the system comprises a conductive adhesive adhering a connection post of the one or more devices to a contact pad of the two or more contact pads.

In certain embodiments, the device comprises one or more micro-transfer printed integrated circuits, each micro-transfer printed integrated circuit having a fractured, broken, or separated tether.

In another aspect, the present invention is directed to a method of making a system, comprising: providing a system substrate with two or more contact pads disposed on the system substrate; providing one or more source wafers each having one or more micro-transfer printable devices disposed thereon, each device comprising two or more connection posts; micro-transfer printing one or more devices from each of the one or more source wafers to the two or more contact pads with a transfer stamp comprising a corresponding one or more transfer stamp pillars such that each connection post physically contacts a contact pad of the two or more contact pads and forms a first imprint in the physically contacted contact pad; removing a defective device from the two or more contact pads to provide at least one exposed, imprinted contact pad comprising the first imprint; and micro-transfer printing a replacement device from one of the one or more source wafers to the two or more contact pads such that at least one connection post physically contacts the exposed, imprinted contact pad to form a second imprint.

In certain embodiments, the first imprint is covered by the replacement device.

In certain embodiments, the method comprises testing the one or more devices after micro-transfer printing to determine one or more defective devices.

In certain embodiments, removing the defective device from the two or more contact pads comprises: providing a removal stamp comprising a removal stamp pillar; and dislodging the defective device from the contact pads with the removal stamp pillar by contacting the defective device with the removal stamp pillar.

In certain embodiments, the defective device is removed from the two or more contact pads by translating the removal stamp pillar over a surface of the system substrate.

In certain embodiments, the removal stamp pillar has a structured distal end comprising a cavity having a cavity size that is larger than the defective device and removing the defective device from the two or more contact pads comprises locating the defective device within the cavity.

In certain embodiments, the defective device has an edge that extends an edge length in a direction substantially parallel to the system substrate surface and wherein the removal stamp pillar has a side with a length equal to or greater than the edge length.

In certain embodiments, the defective device has a length greater than a width and removing the defective device from the two or more contact pads comprises contacting the removal stamp pillar to the defective device along at least a portion of the length of the defective device.

In certain embodiments, the removal stamp pillar has an adhesive distal end having an adhesion greater than an adhesion of a transfer stamp pillar of the transfer stamp to the defective device. In certain embodiments, the removal stamp pillar is harder than one or more transfer stamp pillars of the transfer stamp. In certain embodiments, the removal stamp comprises only one pillar.

In certain embodiments, the removal stamp pillar comprises a channel through which compressed gas can be expelled or through which a partial vacuum can be applied to adhere the defective device to the removal stamp pillar. In certain embodiments, removing the defective device comprises blowing a gas onto the defective device or sucking up the defective device with at least a partial vacuum.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 5 is a schematic cross section illustrating another exemplary method according to illustrative embodiments of the present invention;

FIG. 6 is a perspective of a stamp pillar according to illustrative embodiments of the present invention;

Figure 1A:
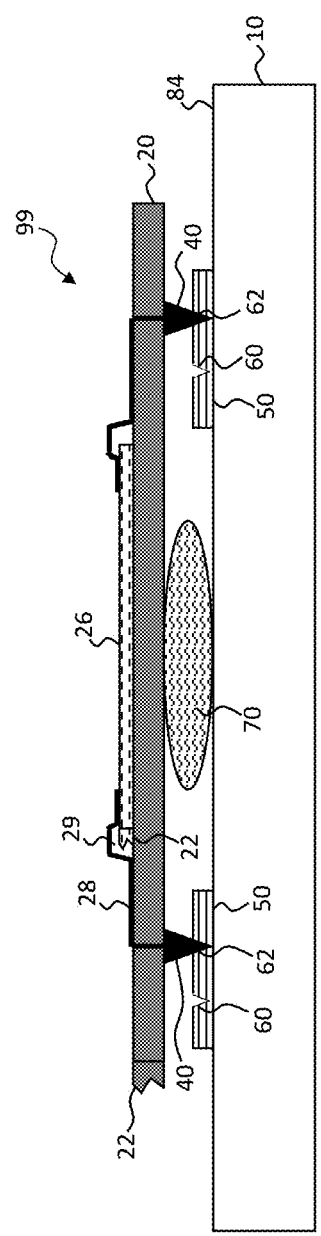
FIG. 1A is a cross section of a transfer printed system according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, structures and methods that enable large, high-yield, cost-effective, and electrically connected arrays of relatively small integrated circuit chiplets or assemblies at a high resolution on a relatively large destination substrate despite materials and manufacturing process variability and contamination.

Figure 1B:
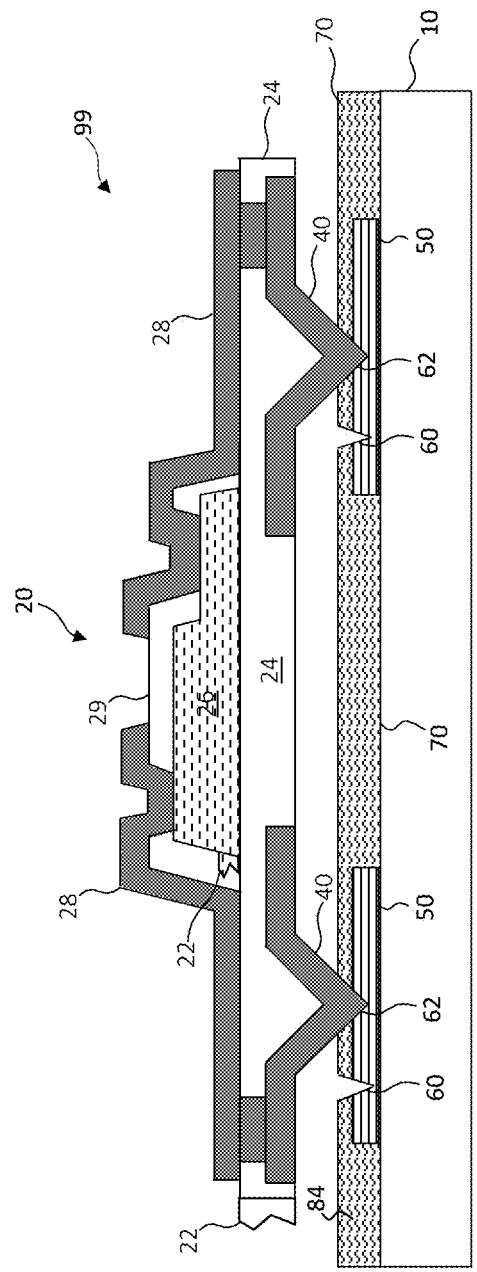
FIG. 1B is a detailed cross section of a transfer printed system according to illustrative embodiments of the present invention.

Referring to FIGS. 1A and 1B, in some embodiments of the present invention, a repaired transfer-printed system 99 includes a system substrate 10. Two or more contact pads 50 are disposed on the system substrate 10 and one or more micro-transfer printed devices 20 are disposed in contact with the contact pads 50 or system substrate 10. Each device 20 has two or more connection posts 40. Each connection post 40 is in physical and electrical contact with a contact pad 50 and forms a second imprint 62 in the physically contacted contact pad 50, for example by piercing or deforming the physically contacted contact pad 50.

At least one of the physically contacted contact pads 50 has a first imprint 60 that is between the device 20 and system substrate 10 so that the at least one first imprint 60 is covered by the device 20 over the system substrate 10. An adhesive 70 can be located between the device 20 and the system substrate 10 to adhere the device 20 to the system substrate 10. The adhesive 70 can be in a patterned layer (as shown in FIG. 1A) or unpatterned layer (as shown in FIG. 1B) and can cover the contact pads 50. In some embodiments, an adhesive 70 is non-conductive (as shown in FIG. 1B). In some embodiments, an adhesive 70 is electrically conductive and is patterned over contact pads 50 to electrically isolate the contact pads 50 electrically connected to connection posts 40 of a common device 20.

In some embodiments, a system 99 is an electronic system, connection posts 40 are electrically conductive connection posts, and a device 20 is an electronic device (i) responsive to electrical signals received through the connection posts 40 or (ii) providing electrical signals through the connection posts 40. In some embodiments, a device 20 responds to electrical signals with an optical or electrical response. Referring again to FIGS. 1A and 1B, the connection posts 40 are electrically connected to the contact pads 50 and electrical signals can pass through the contact pads 50, the connection posts 40, and electrodes 28 to and from an electronic device circuit 26 in the device 20. An electronic device circuit 26 can be an integrated circuit or an assembly of integrated circuits.

A first or second imprint 60, 62 is a mark, hole, protrusion, or deformation in a contact pad 50 formed by pressure from a connection post 40 impressed upon the contact pad 50, for example by transfer printing (e.g., micro-transfer printing) the device 20 connected to the connection post 40. A system substrate 10 is any structure with a surface 84 on which contact pads 50 can be formed and onto which devices 20 can be transfer printed (e.g., micro-transfer printed). Suitable system substrates 10 can be, for example, display, glass, plastic, ceramic, or other available substrates. Contact pads 50 can be portions of a patterned electrically conductive metal layer formed on a system substrate 10, for example, using photolithographic methods and materials useful in printed circuit boards or flat-panel displays. Devices 20 can be electronic devices or assemblies, including, for example, integrated circuits or chiplets (small integrated circuits, for example having at least one of a length and a width less than or equal to 100, 50, 25, 10, or 5 microns), including light-emitting diodes (LEDs), photosensors, or assemblies of integrated circuits or chiplets forming electronic device circuit 26 and made using integrated circuit or printed circuit board methods and materials.

A connection post 40 is an electrically conductive protrusion that extends from a substrate or surface and is electrically connected to an electronic element in a device 20, such as an integrated circuit or an electronic circuit including a plurality of integrated circuits or other electronic elements such as resistors or capacitors. Connection posts 40 can be a multi-layer structure having a dielectric core covered, at least in part, by a conductive layer. For example, a silicon oxide or silicon nitride core can be covered, at least in part, by a metal layer, as shown in FIG. 1B, where the device substrate 24 is a dielectric.

By the first imprint 60 being "between a device and a system substrate" is meant that a line taken orthogonally to the surface 84 of the system substrate 10 from the first imprint 60 will encounter the device 20 on the same side of the system substrate 10 as the first imprint 60 so that the first imprint 60 is covered by the device 20 on or over the system substrate 10. In certain embodiments, when a device 20 is micro-transfer printed using a stamp adhered to the top side of the device 20 opposite connection posts 40, the connection posts 40 contact the surface (e.g., system substrate 10 surface 84) to which the devices 20 are being micro-transfer printed to form an electrical connection between the connection posts 40 and contact pads 50 on the surface 84.

Figure 2A:
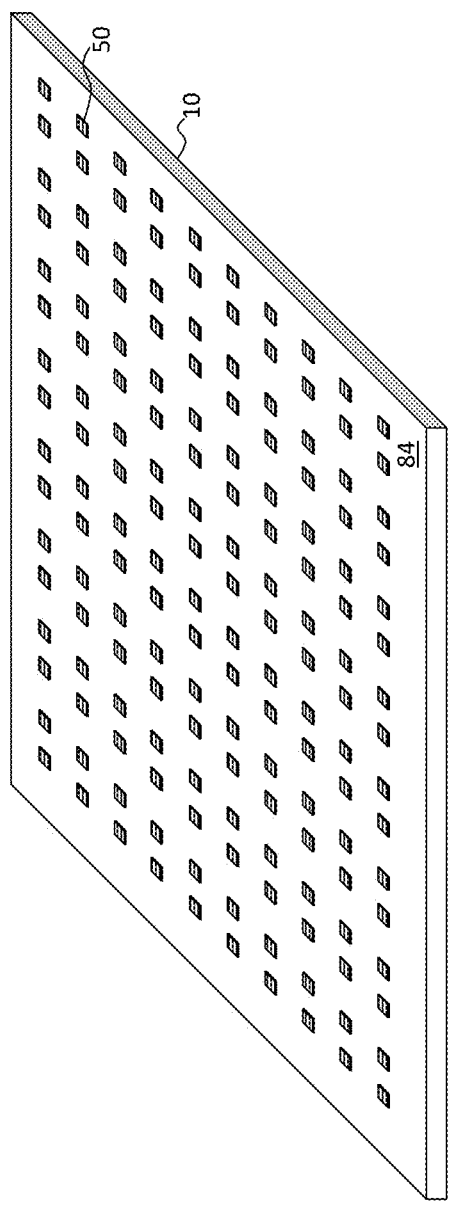
FIG. 2A is a perspective of a destination substrate backplane with an array of contact pads and FIG. 2B is a corresponding perspective including row and column wires and a system controller according to illustrative embodiments of the present invention.
Figure 2B:
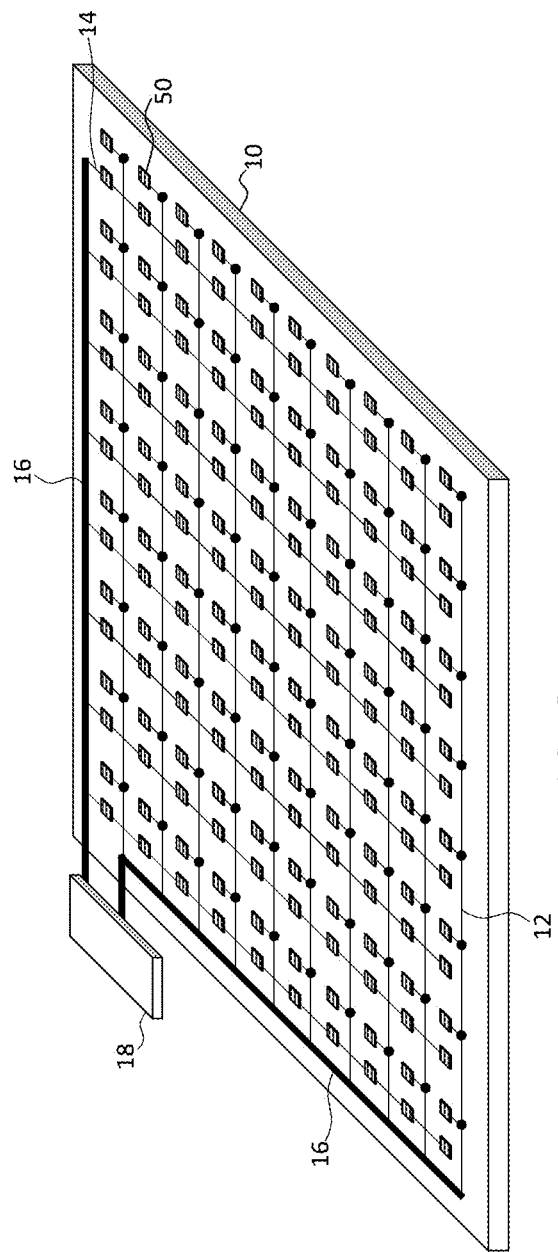

FIG. 2A illustrates contact pads 50 distributed over the surface 84 of a system substrate 10. FIG. 2B shows the contact pads 50 of FIG. 2A electrically connected in a matrix arrangement with row wires 12 and column wires 14, as is customary in flat-panel displays or array sensors. The row and column wires 12, 14 are electrically connected through buses 16 to a system controller 18. A system controller 18 can include multiple control elements, for example row and column integrated circuit controllers electrically connected to row and column wires 12, 14, respectively. Row and column controllers are typically disposed on the system substrate in matrix-addressed systems such as displays or array sensors but are omitted here to simplify the description. Such wire and control structures on and associated with system substrates 10 can be made using photolithographic methods found in the display and printed-circuit board industries.

Figure 3A:
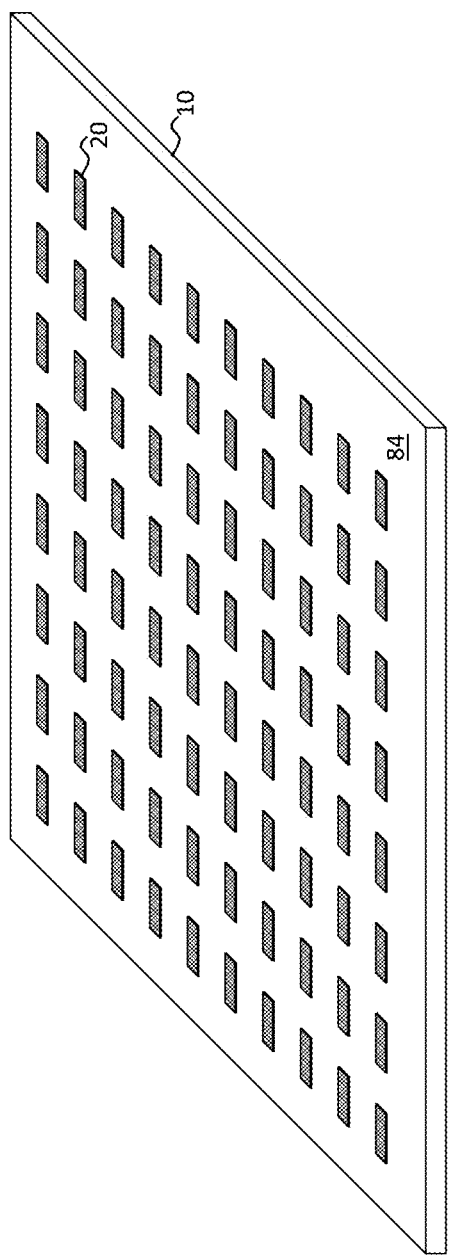
FIG. 3A is a perspective of a destination substrate backplane with an array of devices and FIG. 3B is a corresponding perspective including row and column wires and a system controller according to illustrative embodiments of the present invention.
Figure 3B:
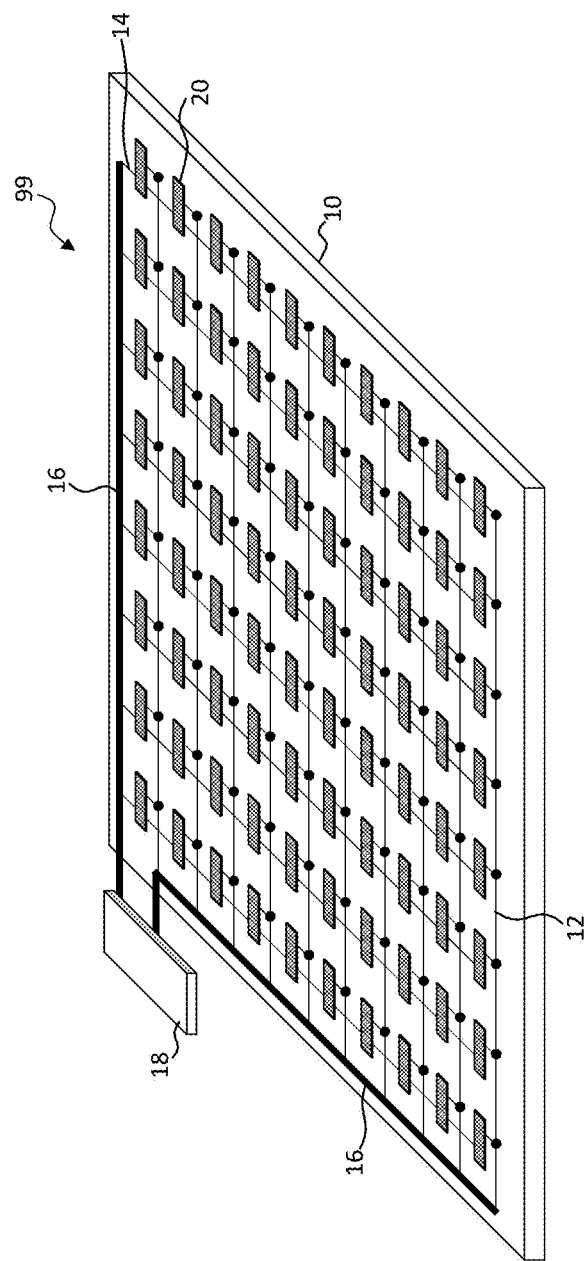

In some embodiments, contact pads 50 are arranged in pairs, each pair associated with a device 20. FIG. 3A illustrates devices 20 disposed in an array over the surface 84 of a system substrate 10 and physical and electrically connected to pair of contact pads 50 (obscured in FIGS. 3A and 3B by the devices 20). In this illustration, each device 20 has two connection posts 40 (for example, in accordance with FIGS. 1A, 1B) and is electrically connected to the two contact pads 50 in each pair. However, in some embodiments, devices 20 include more than two connection posts 40 and a system substrate 10 has groups of contact pads 50 having more than two contact pads 50 that are associated with and electrically connected to the devices 20. Referring to FIG. 3B, the devices 20 are electrically connected through the row and column wires 12, 14 and buses 16 to the system controller 18.

Contact pads 50 can be electrically conductive metal portions of a patterned electrically conductive metal layer formed on a system substrate 10 that are dedicated to and located specially for the connection posts 40 of devices 20. In such embodiments, the contact pads 50 can be completely between the devices 20 and the system substrate 10 so that the contact pads 50 are covered by the devices 20 over the system substrate 10. In some embodiments, contact pads 50 can be designated portions of an electrical conductor that transmits electrical signals from one location on a system substrate 10 to another location. For example, contact pads 50 can be designated portions of row or column wires 12, 14. In such embodiments, contact pads 50 can extend beyond a device 20 over the system substrate 10.

Devices 20 can be transfer printed devices 20. In some embodiments, devices 20 are micro-transfer printed devices 20 and include at least or portion of a broken, fractured, or separated tether 22 (for example, as shown in FIGS. 1A, 1B). Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485. For a discussion of micro-transfer printing techniques see, U.S. Pat. Nos. 8,722,458, 7,622,367 and 8,506,867, the disclosure of each of which is hereby incorporated by reference in its entirety.

Devices 20 in accordance with some embodiments of the present invention can have multiple electronic elements, such as integrated circuits or LEDs, disposed on a device substrate 24 and transfer printed (e.g., micro-transfer printed) as a unit from a device source wafer to a destination substrate such as system substrate 10. In some embodiments, electronic elements themselves are micro-transfer printed to a device substrate 24 and therefore can each have broken, fractured, or separated tethers 22, as shown in FIGS. 1A, 1B. Thus, micro-transfer printing using compound micro-assembly structures and methods can be used with certain embodiments of the present invention, for example, as described in U.S. patent application Ser. No. 14/822,868, filed Aug. 10, 2015, entitled Compound Micro-Assembly Strategies and Devices, by Bower et al., the disclosure of which is hereby incorporated by reference in its entirety. In some embodiments, a device 20 is a compound micro-assembled device. Additional details useful in understanding and performing aspects of certain embodiments of the present invention are described in U.S. patent application Ser. No. 14/743,981, filed Jun. 18, 2015, entitled Micro Assembled LED Displays and Lighting Elements, by Bower et al., the disclosure of which is hereby incorporated by reference in its entirety.

Connection posts 40 and their construction are described in more detail in U.S. patent application Ser. No. 14/743,788 filed Jun. 18, 2015 entitled Micro-Assembled LED Displays and Lighting Elements by Bower et al., U.S. patent application Ser. No. 14/822,864 filed Aug. 10, 2015 entitled Chiplets with Connection Posts by Prevatte et al., and U.S. Provisional Patent Application No. 62/317,107 filed Apr. 1, 2016 entitled Pressure-Activated Electrical Interconnection by Micro-Transfer Printing by Bower et al.

Micro-transfer printed device repair is discussed in U.S. patent application Ser. No. 15/040,810, filed Feb. 10, 2016 entitled Matrix-Addressed Device Repair by Cok et al. and in U.S. patent application Ser. No. 14/807,226, filed Jul. 23, 2015, entitled Parallel Redundant Chiplet System by Cok et al.

Referring to FIG. 10 and FIGS. 4A-4C, an exemplary method in accordance with certain embodiments of the present invention includes providing a system substrate 10 with two or more contact pads 50 disposed on the system substrate 10 in step 100. One or more device source wafers is provided in step 110, each having one or more micro-transfer printable devices 20 disposed or in the device source wafer. The devices 20 each have two or more connection posts 40. In step 120, one or more devices 20 are micro-transfer printed from one or more of the source wafers to the system substrate 10 with a transfer stamp having a corresponding one or more transfer stamp pillars. When the devices 20 are micro-transfer printed from the source wafer to the system substrate 10 or contact pads 50, each of the connection posts 40 physically contacts a contact pad 50 and forms a first imprint 60 in the physically contacted contact pad 50.

In some embodiments step 130 is included such that the devices 20 are tested to determine faulty devices 20F, for example by providing control signals from a system controller 18 to the devices 20 through the row and column wires 12, 14, the contact pads 50, the connection posts 40, and the electrodes 28 to a device circuit 26 and observing any response to the signals, whether electrical or optical. In some embodiments, devices 20 include test pads that can be electrically probed after the devices 20 are printed (e.g., micro-transfer printed) to determine device 20 functionality. In some embodiments, a system substrate 10 can be optically inspected to determine faulty, defective, or missing devices 20F disposed thereon or electrical connections between the devices 20F and contact pads 50 on the system substrate 10. A defective device 20F can be defective because it was manufactured defectively or because the transfer printing (e.g., micro-transfer printing) of the device 20F was faulty, for example making a bad electrical connection between a connection post 40 and contact pad 50, for example due to dust particles on the contact pad 50.

Figure 4A:
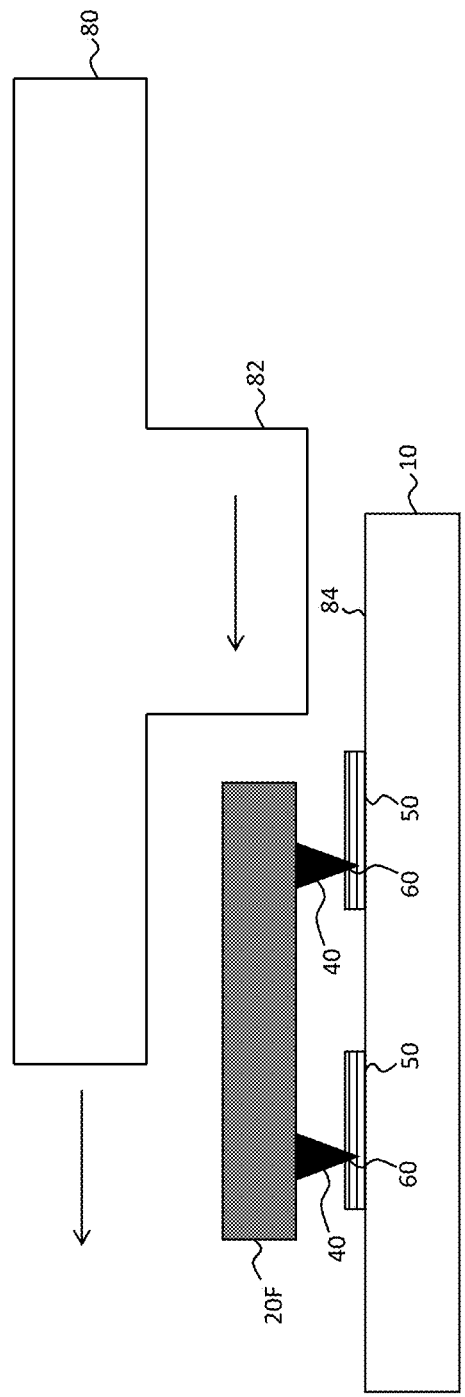
FIG. 4A is a schematic cross section.
Figure 4B:
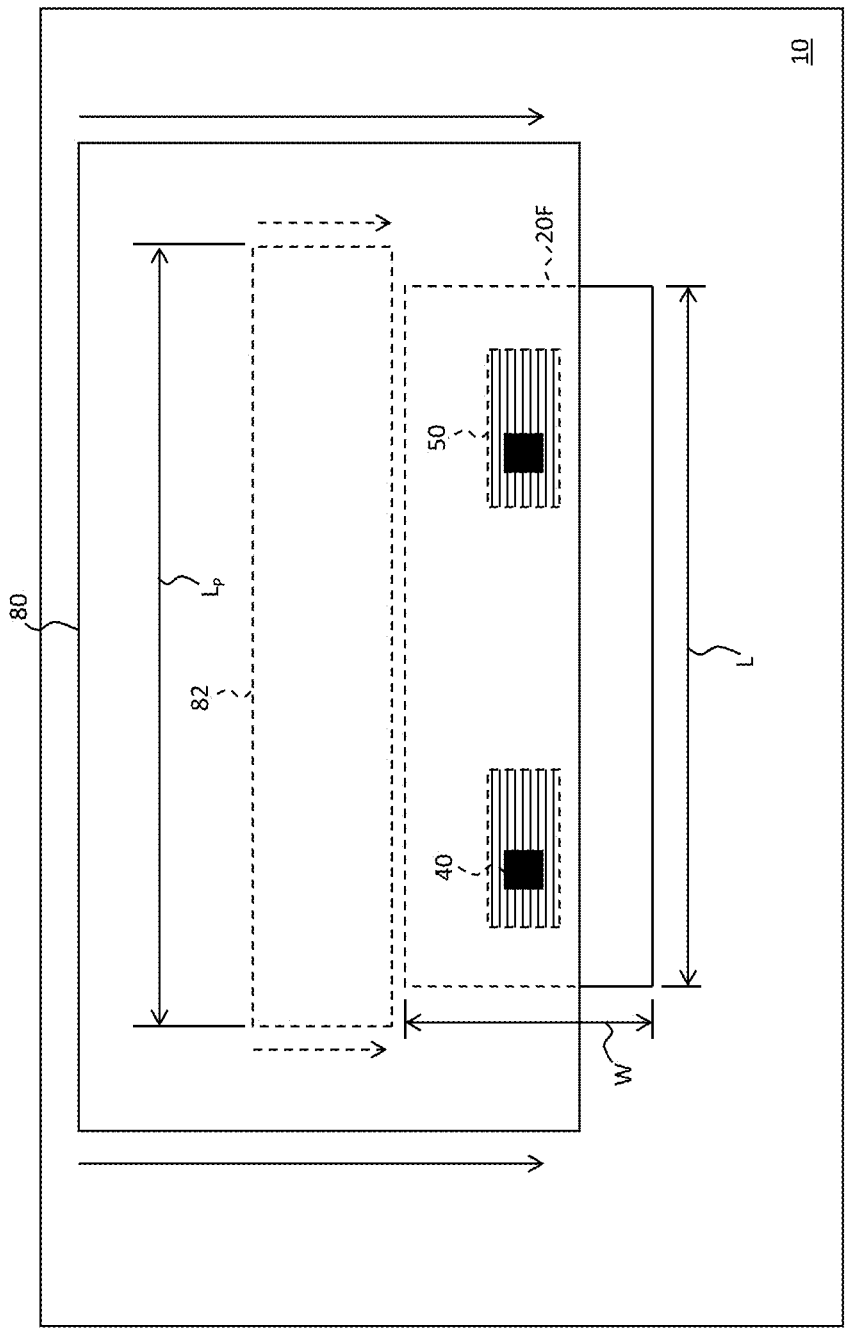
FIG. 4B is a corresponding schematic plan view.
Figure 4C:
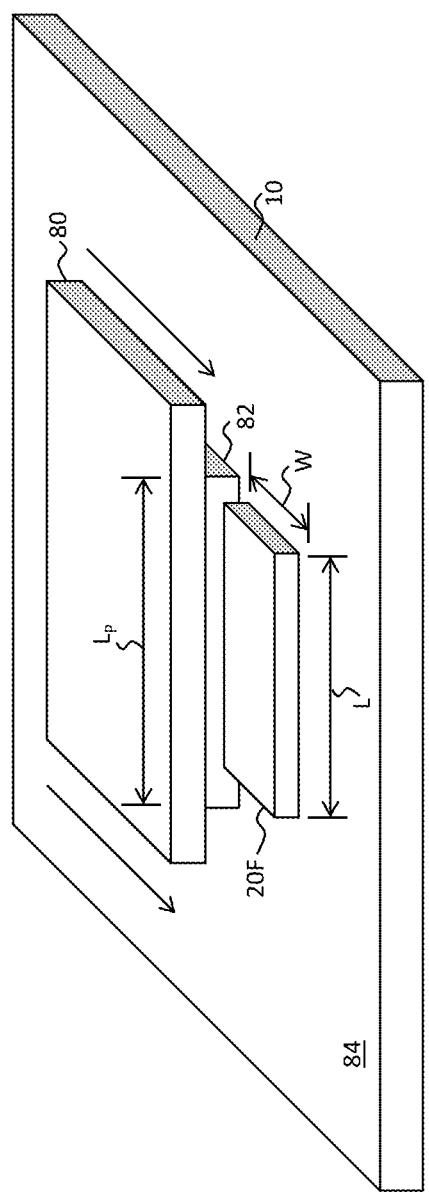
FIG. 4C is a corresponding perspective illustrating an exemplary method according to illustrative embodiments of the present invention.

In step 140, the defective or faulty device 20F is removed in any one of various ways in accordance with some embodiments of the present invention. Referring to FIGS. 4A-4C in a cross section, plan view, and perspective of the same step, respectively, a removal stamp 80 having a single pillar that is a removal stamp pillar 82 is provided and located adjacent to a defective device 20F to be removed. In the exemplary embodiment illustrated in FIGS. 4A-4C, the removal stamp 80 and removal stamp pillar 82 are spatially translated across the surface 84 of the system substrate 10 and the removal stamp pillar 82 physically and mechanically contacts and dislodges the defective device 20F. Translating a removal stamp pillar 82 means physically moving the removal stamp pillar 82 in a horizontal direction substantially parallel to a surface 84 of a system substrate 10, or at least in a direction that prevents contact between the removal stamp pillar 82 and the system substrate 10 while contacting a defective device 20F with the removal stamp pillar 82. In some embodiments, other devices, such as mechanical elements similar to probes or probe tips can be spatially translated across the system substrate 10 surface 84 to dislodge defective devices 20F.

Referring to FIG. 5, in some embodiments, the removal stamp pillar 82 has a sticky surface on the distal end of the removal stamp pillar 82 that has a greater adhesion to the device 20 than the original transfer stamp did, and an adhesion sufficient to dislodge and remove the faulty device 20 from the system substrate 10 and the connection posts 40 from the contact pads 50. This technique can control the location of the defective device 20F after removal and aid in disposing of the defective device 20F, for example by contacting the removed defective device 20F to a sticky sheet with even greater adhesion to the removed defective device 20F than the removal stamp pillar 82. To facilitate removal, a removal stamp pillar 82 can be harder than a transfer stamp pillar of a transfer stamp.

Referring to FIG. 6, to facilitate the removal process, the distal end of the removal stamp pillar 82 can have a structured distal end with a cavity 86 having a cavity size that is larger than the defective device 20F and locating the defective device 20F within the cavity 86. The removal stamp pillar 82 is then translated as described above to dislodge the defective device 20F. This approach can also control the location of the defective device 20F after removal and can adhere the defective device 20F to the removal stamp pillar 82 to aid in disposing of the defective device 20F.

In some embodiments, and as shown in FIGS. 4B and 4C, a defective device 20F has a length L greater than a width W. A removal stamp pillar 82 contacts the defective device 20F along at least a portion of the length L of the defective device 20F. A defective device 20 can have an edge that extends an edge length L in a direction substantially parallel to a system substrate 10 surface 84 and a removal stamp pillar 82 can have a side with a length $L_P$ equal to or greater than the edge length L that contacts the edge. By providing removal stamp pillars 82 with longer edges, a defective device 20F is less likely to fracture or leave detritus in the contact pad 50 area.

In some embodiments of the present invention, a removal stamp pillar 82 has a channel 88 through which a partial vacuum can be applied to adhere a defective device 20F to the removal stamp pillar 82 or through which compressed gas can be expelled to dislodge the defective device 20F. Thus, methods in accordance with certain embodiments of the present invention can include blowing a gas onto the defective device 20F or sucking up the defective device 20F with at least a partial vacuum. Such pressure-controlled removal tools can be separate and operate separately from a removal stamp 80.

Referring again to FIG. 10, after the defective device 20F is removed in step 140, the contact pad 50 at the location of the removed defective device 20F is exposed and retains the first imprint 60 of the connection posts 40 of the removed defective device 20F from step 120. In step 150, a replacement device 20 can be micro-transfer printed onto the same contact pads 50 and in the same location as the moved defective device 20F. The connection posts 40 of the second micro-transfer printed device 20 will form second imprints 62 in the contact pads 50 and at least one of first imprints 60 will be located between the replacement device 20 and the system substrate 10, since the replacement device 20 is typically the same size and type as the first defective device 20F. Because of variability in the micro-transfer printing process, it is unlikely that the second imprints 62 will be located exactly where the first imprints 60 are located. Hence, first and second imprints 60, 62 are formed in slightly different locations on the same contact pad 50. The replacement devices 20 can then be tested and defective replacement devices 20F removed and replaced again so that the process is repeated until all of the devices 20 are acceptably functional.

Figure 7:
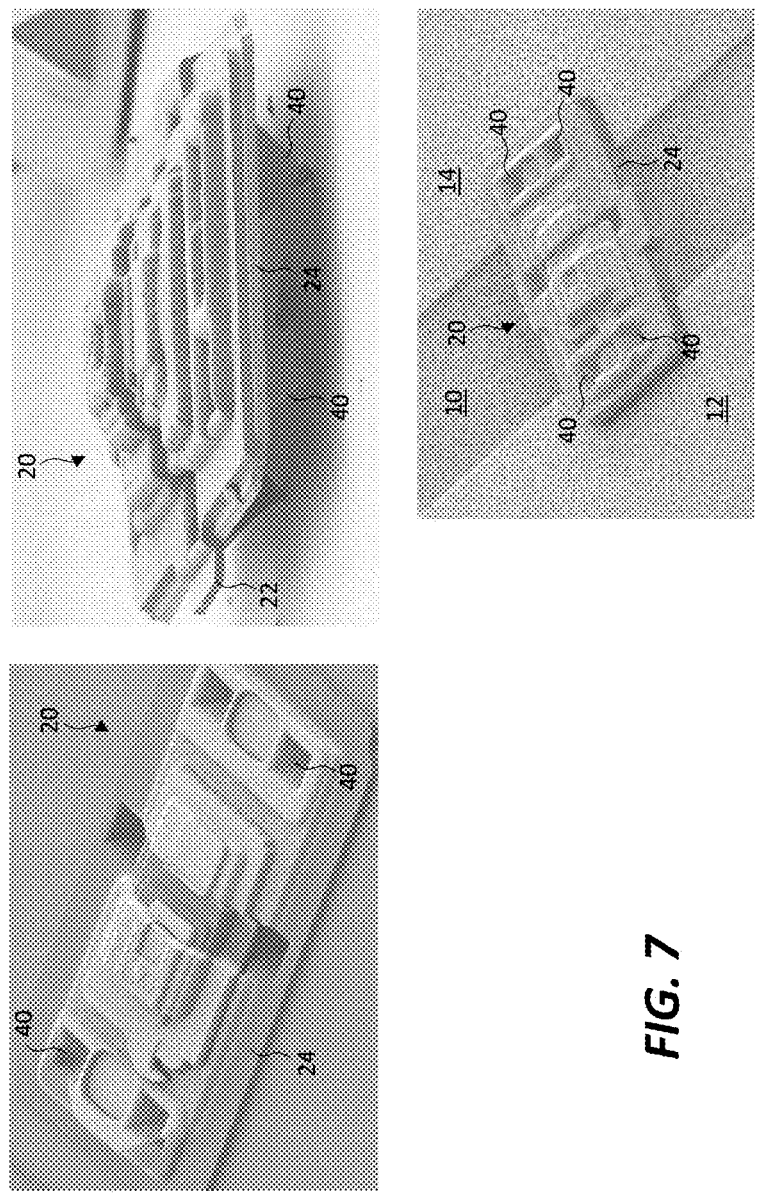
FIG. 7 shows three micrographs of a micro-transfer printable device according to illustrative embodiments of the present invention.

Micro-transfer printed devices 20 have been constructed as illustrated in FIG. 7. The devices 20 have connection posts 40, a device substrate 24 and a fractured tether 22 and are micro-transfer printed onto a system substrate 10 in electrical contact with row and column wires 12, 14. In the exemplary embodiment of FIGS. 7-9, each device 20 has two, electrically common connection posts 40 connected to each contact pad 50, as well as additional non-conductive posts that aid in adhering the device 20 to the system substrate 10.

Figure 8:
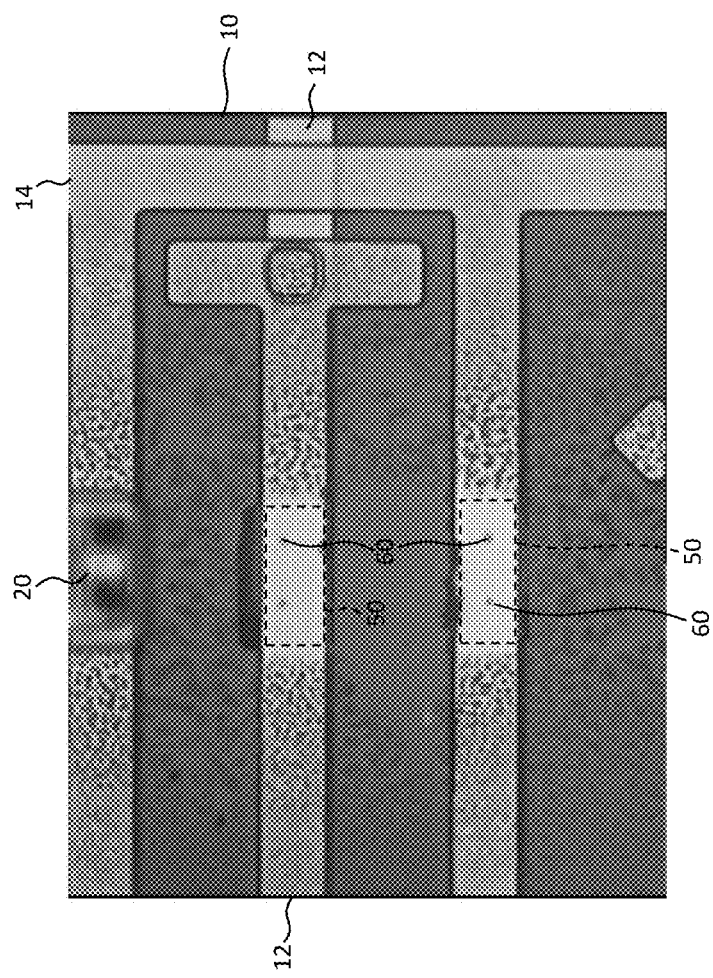
FIG. 8 is a micrograph of connection post imprints according to illustrative embodiments of the present invention.

Referring to FIG. 8, a system substrate 10 with row and column wires 12, 14 define contact pads 50. First imprints 60 are shown where connection pads 40 of a removed defective device 20F physically contacted the contact pads 50. An operational device 20 is also shown.

Figure 9:
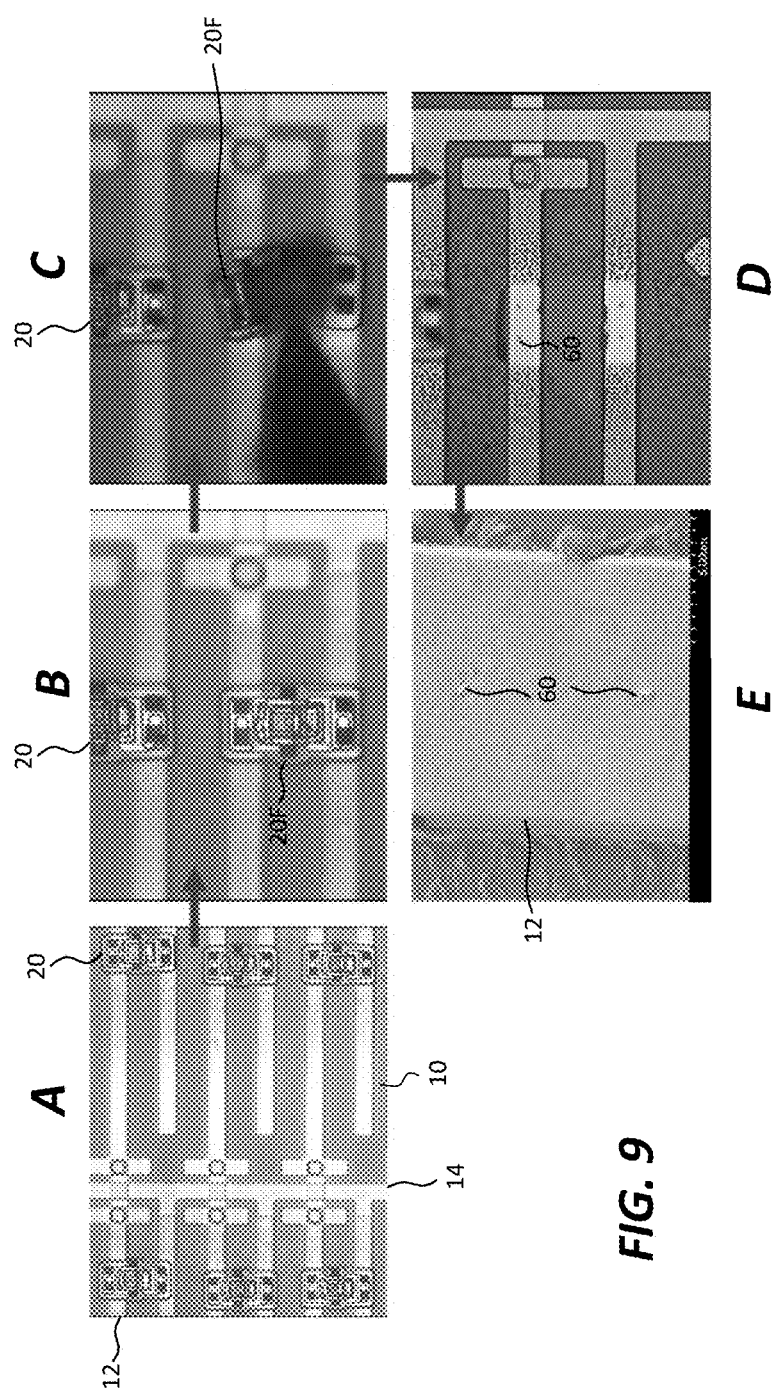
FIG. 9 panels A-E are micrographs showing sequential steps of an exemplary method and structures according to illustrative embodiments of the present invention.
Figure 10:
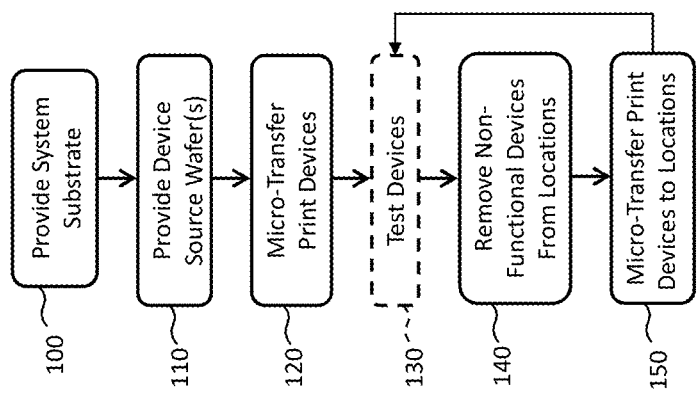
FIG. 10 is a flow chart illustrating an exemplary method according to illustrative embodiments of the present invention.

Referring to FIG. 9, panels A-E, the process illustrated in FIG. 10 is shown. A set of devices 20 are micro-transfer printed onto the system substrate 10 and the device 20 connection posts 40 (not visible) are electrically connected to and imprint the row and column wires 12, 14 of the system substrate 10 (as shown in panel A). The devices 20 are tested through the row and column wires 12, 14. Panel B is a magnified view of a device 20 determined to be functional and a device 20F that is determined to be defective and non-functional. As shown in panel C, the defective device 20F is dislodged and mechanically removed, leaving first imprints 60 (as shown in panels D and E at higher magnification, panel D corresponds to FIG. 8). A replacement device 20 is then micro-transfer printed in the same location as the removed defective device 20F (not shown but is not distinguishable from FIG. 9B).

Figure 11A:
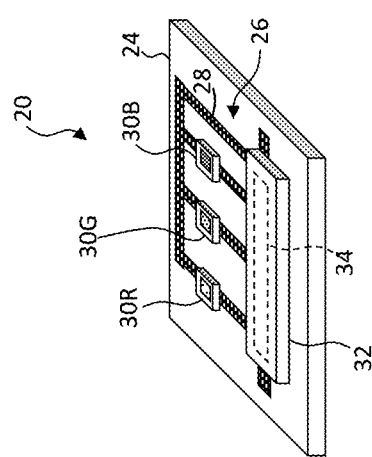
FIG. 11A is a schematic perspective of a device having a controller and three LEDs.
Figure 11B:
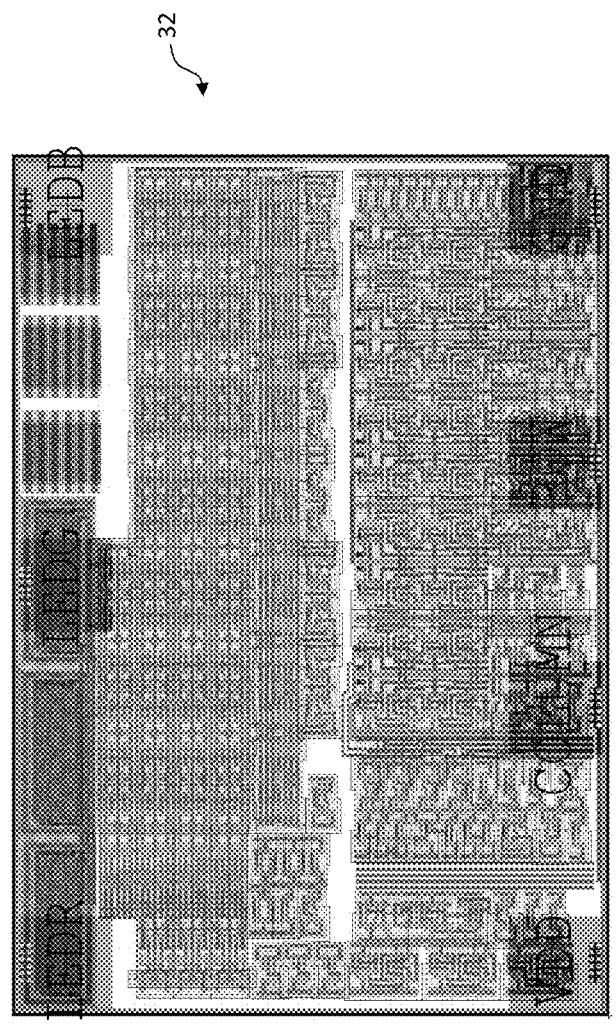
FIG. 11B is a layout schematic of the controller.
Figure 11C:
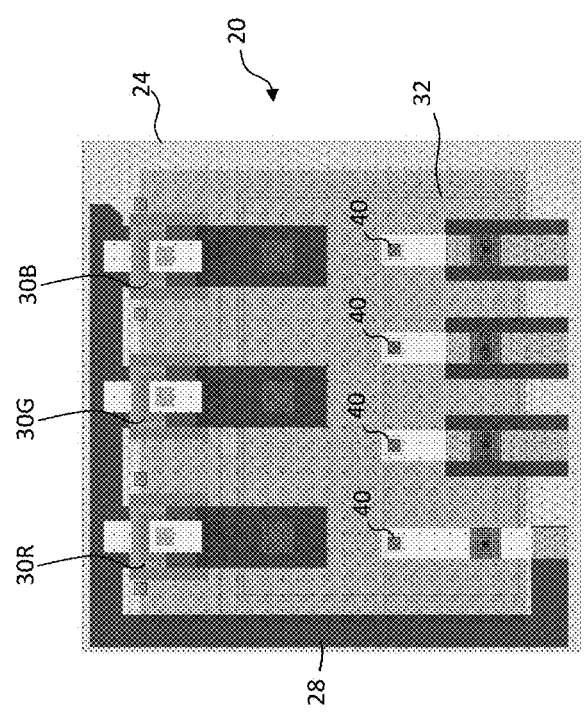
FIG. 11C is a layout schematic of the device, in accordance with illustrative embodiments of the present invention.

FIG. 9 illustrates a micro-transfer printed system wherein the device 20 is a single integrated circuit, in this case a light-emitting diode (LED). In some embodiments, a device 20 is an electronic circuit including a plurality of integrated circuits or other electronic elements. Referring to FIGS. 11A-11C, a device 20 includes four electrically connected integrated circuit electronic elements disposed on a device substrate 24. One of the four integrated circuits is a device controller 32 having a control circuit 34 and the other three are LEDs 30R, 30G, 30B, each emitting a different color of light, in this case red, green, and blue light, forming a multi-color pixel in an active-matrix display. The device 20 has four electrically conductive connection posts 40, as well as some non-conductive posts used to provide stability and improved micro-transfer printing. FIG. 11 is a layout design for the device controller 32 and FIG. 12 is the layout design for the device 20. The four connection posts 40 are electrically connected to a ground, a power, a row, and a column signal, respectively. The four integrated circuits (32, 30R, 30G, 30B) can themselves be micro-transfer printed onto the device substrate 24 and can themselves include fractured, broken, or separated tethers.

Integrated circuits included in devices 20 in accordance with certain embodiments of the present invention can include CMOS circuits or inorganic micro-light-emitting diodes (micro-iLEDs) having a light-emitting side disposed to emit light. In some embodiments, devices 20 are micro-lasers (e.g., diode micro-lasers). A micro-laser can be one or more of a solid-state laser, a semiconductor-based lasers, a diode-pumped solid-state laser (DPSSL), a vertical-cavity surface-emission laser (VCSEL), and a colloidal quantum-dot vertical-cavity surface-emission laser (CQD-VCSEL). Micro-LEDs having various structures can be made using, for example, doped or undoped semiconductor materials and can be made using photolithographic techniques. An inorganic LED (iLED) can be a micro-LED. The term micro-LED is used herein to generically refer to iLED devices. It is understood that where reference is made to a micro-LED, a micro-laser can be substituted. The integrated circuits can be relatively small, for example, in some embodiments, each device 20 or integrated circuit within a device 20 has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm. In some embodiments, devices 20 are formed in substrates or on supports separate, distinct, and independent from a system substrate 10 (e.g., device substrate 24).

As is understood by those skilled in the art, the terms "over" and "under" are relative terms and can be interchanged in reference to different orientations of the layers, elements, and substrates that may be included in a particular embodiment of the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

L length
$L_P$ pillar length
W width
10 system substrate
12 row wire
14 column wire
16 bus
18 system controller
20 device
20F faulty device
22 tether
24 device substrate
26 device circuit
28 electrodes
29 dielectric
30R red LED
30G green LED
30B blue LED
32 device controller
34 control circuit
40 connection post
50 contact pad
60 first imprint
62 second imprint
70 adhesive
80 removal stamp
82 removal stamp pillar
84 surface
86 cavity
88 channel
99 repaired micro-transfer printed system
100 provide system substrate step
110 provide device source wafer step
120 micro-transfer print devices step
130 test devices step
140 remove non-functional devices from locations step
150 micro-transfer print elements to locations step

What is claimed:

1. A repaired transfer-printed system, comprising:
a system substrate;
two or more contact pads disposed on the system substrate;
one or more transfer printed devices, each device comprising two or more connection posts, wherein each connection post is in physical contact with a contact pad of the two or more contact pads and forms a second imprint in the contact pad; and
a first imprint in at least one of the physically contacted contact pads that is between the device and the system substrate.

2. The system of claim 1, wherein the system is an electronic system, the connection posts are electrically conductive connection posts, and the device is an electronic device (i) responsive to electrical signals received through the connection posts or (ii) providing electrical signals through the connection posts.

3. The system of claim 1, wherein the contact pads extend beyond each of the one or more devices.

4. The system of claim 1, wherein the contact pads are covered by each of the one or more devices.

5. The system of claim 1, wherein each of the one or more devices comprises at least a portion of a tether.

6. The system of claim 1, wherein each of the two or more connection posts of each device pierce or deform each contact pad that they physically contact.

7. The system of claim 1, wherein each of the two or more connection posts of each device is a multi-layer connection post comprising an electrically conductive layer disposed on a dielectric core.

8. The system of claim 1, comprising a non-conductive adhesive adhering each of the one or more devices to the system substrate.

9. The system of claim 1, comprising a conductive adhesive adhering a connection post of the one or more devices to a contact pad of the two or more contact pads.

10. The system of claim 1, wherein the device comprises one or more micro-transfer printed integrated circuits, each micro-transfer printed integrated circuit having a fractured, broken, or separated tether.

11. A method of making a system, comprising:
providing a system substrate with two or more contact pads disposed on the system substrate;
providing one or more source wafers each having one or more micro-transfer printable devices disposed thereon, each device comprising two or more connection posts;

micro-transfer printing one or more devices from each of the one or more source wafers to the two or more contact pads with a transfer stamp comprising a corresponding one or more transfer stamp pillars such that each connection post physically contacts a contact pad of the two or more contact pads and forms a first imprint in the physically contacted contact pad;

removing a defective device from the two or more contact pads to provide at least one exposed, imprinted contact pad comprising the first imprint; and micro-transfer printing a replacement device from one of the one or more source wafers to the two or more contact pads such that at least one connection post physically contacts the exposed, imprinted contact pad to form a second imprint.

12. The method of claim 11, wherein the first imprint is covered by the replacement device.

13. The method of claim 12, comprising testing the one or more devices after micro-transfer printing to determine one or more defective devices.

14. The method of claim 12, wherein removing the defective device from the two or more contact pads comprises:

providing a removal stamp comprising a removal stamp pillar; and dislodging the defective device from the contact pads with the removal stamp pillar by contacting the defective device with the removal stamp pillar.

15. The method of claim 14, wherein the defective device is removed from the two or more contact pads by translating the removal stamp pillar over a surface of the system substrate.

16. The method of claim 15, wherein the removal stamp pillar has a structured distal end comprising a cavity having a cavity size that is larger than the defective device and removing the defective device from the two or more contact pads comprises locating the defective device within the cavity.

17. The method of claim 14, wherein the defective device has an edge that extends an edge length in a direction substantially parallel to the system substrate surface and wherein the removal stamp pillar has a side with a length equal to or greater than the edge length.

18. The method of claim 14, wherein the defective device has a length greater than a width and removing the defective device from the two or more contact pads comprises contacting the removal stamp pillar to the defective device along at least a portion of the length of the defective device.

19. The method of claim 14, wherein the removal stamp pillar has an adhesive distal end having an adhesion greater than an adhesion of a transfer stamp pillar of the transfer stamp to the defective device.

20. The method of claim 14, wherein the removal stamp pillar is harder than one or more transfer stamp pillars of the transfer stamp.

21. The method of claim 14, wherein the removal stamp comprises only one pillar.

22. The method of claim 14, wherein the removal stamp pillar comprises a channel through which compressed gas can be expelled or through which a partial vacuum can be applied to adhere the defective device to the removal stamp pillar.

23. The method of claim 22, wherein removing the defective device comprises blowing a gas onto the defective device or sucking up the defective device with at least a partial vacuum.

\* \* \* \* \*